United States Patent
Mezer et al.

(10) Patent No.: US 8,175,823 B2
(45) Date of Patent: May 8, 2012

(54) PROBING ANALOG SIGNALS

(75) Inventors: Amir Mezer, Haifa (IL); Assaf Benhamou, Haifa (IL)

(73) Assignee: Intel Corporation, Santa Clara, CA (US)

( * ) Notice: Subject to any disclaimer, the term of this patent is extended or adjusted under 35 U.S.C. 154(b) by 641 days.

(21) Appl. No.: 12/316,900

(22) Filed: Dec. 17, 2008

(65) Prior Publication Data

US 2010/0153032 A1    Jun. 17, 2010

(51) Int. Cl.
*H03K 5/153* (2006.01)
(52) U.S. Cl. .................................... 702/57
(58) Field of Classification Search .............. 702/57
See application file for complete search history.

(56) References Cited

U.S. PATENT DOCUMENTS

2007/0124092 A1   5/2007   Strittmatter

OTHER PUBLICATIONS

Analog devices, Serial Digital Output Thermometers, TMP03/TMP04, 2002, p. 1-16.*
Dual A/D converter, Semiconductor Technical Data, 11 pages, 1996.*
Analog to Digital Conversion, Measument computing, printed Jan. 3, 2011, 7 pages.*
"Part 3: Carrier Sense Multiple Access with Collision Detection (CSMA/CD) Access Method and Physical Layer Specifications", IEEE Std 802.3ap™-2007, Dated May 22, 2007, 203 Pages.
Lan, Hai et al., "Simulation and Measurement of On-Chip Supply Noise in Multi-Gigabit I/O Interfaces", 9th International Symposium on Quality Electronic Design, IEEE, Dated 2008, pp. 670-675.

* cited by examiner

*Primary Examiner* — Tung S Lau
(74) *Attorney, Agent, or Firm* — Grossman, Tucker, Perreault & Pfleger, PLLC (57) ABSTRACT

A device, comprising a monitoring slicer adapted to repeatedly sample an internal analog signal to provide a sequence of digital outputs indicating a result of a comparison of the level of the internal analog signal to a reference voltage and an operative unit adapted to perform a task of the device and provide a result without using digital outputs from the monitoring slicer.

13 Claims, 3 Drawing Sheets

PROBING ANALOG SIGNALS

FIELD

The present invention relates to methods of probing analog signals in electronic devices.

BACKGROUND

Electronic devices are used for a wide range of applications, including communication, computing and control. Such devices tend to be complex and therefore require extensive testing during design to assure correct performance. In addition, electronic devices often require monitoring and troubleshooting after installation, throughout their working life.

During debugging, testing and/or troubleshooting, a technician may provide the electronic device with a preselected input signal, and monitor a resulting output signal of the device to determine whether the device is operating properly. However, this is not always sufficient, and in some cases it is desired to monitor internal signals of the device at one or more internal points. A register may be used to store such an internal digital value representation, which can then be retrieved for displaying on an external display for viewing by the technician. When it is desired to view an internal analog signal, the analog signal is generally first converted into a digital form by an analog to digital converter (ADC) and only then is it provided to the external display. An ADC capable of operating at high speeds is typically both large and power hungry. Consequently, many high speed devices are produced without offering any possibility to view internal analog signals for debugging purposes.

BRIEF DESCRIPTION OF THE DRAWINGS

The present invention will now be described in the following detailed description of exemplary embodiments with reference to the attached figures. Generally, only structures, elements or parts that are germane to the discussion are shown.

DETAILED DESCRIPTION

Figure 1:
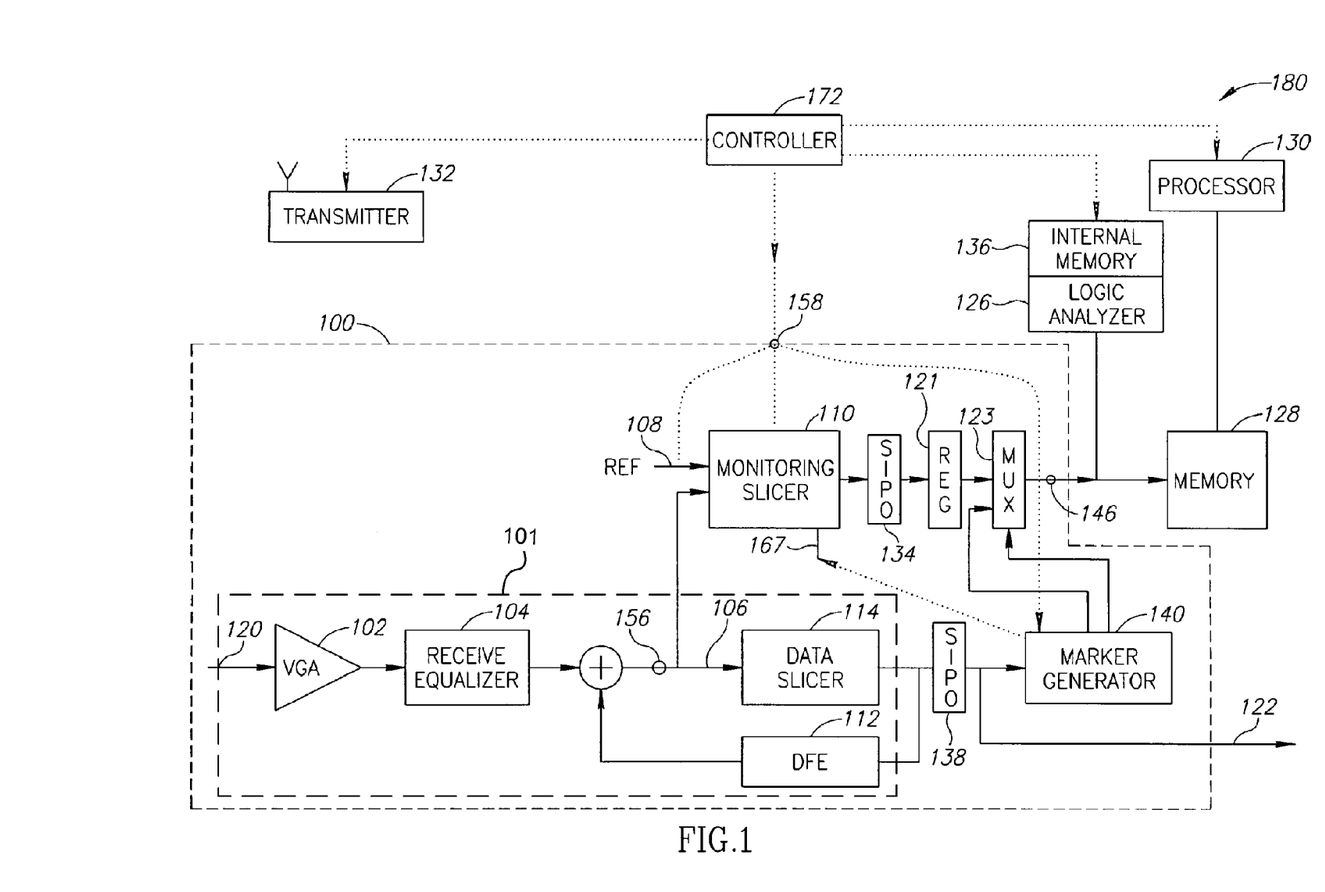
FIG. 1 is a schematic illustration of a high-speed receiver together with external elements for probing, in accordance with one embodiment.

FIG. 1 is a block diagram of a system 180 for determining internal signals of a high-speed receiver 100, in accordance with one embodiment. System 180 includes receiver 100, which is adapted to allow export of internal information to be used in reconstructing an internal signal, as described in detail hereinbelow. In addition, system 180 includes a logic analyzer 126 which retrieves internal data from receiver 100, an external memory 128 in which the retrieved data is stored and a processor 130 configured to reconstruct the internal signal and/or analyze receiver 100 based on the retrieved data. In some embodiments, system 180 includes a transmitter 132 which provides test signals to receiver 100. A controller 172 optionally controls the test process, giving instructions to transmitter 132, logic analyzer 126, elements of receiver 100 and/or processor 130.

Receiver 100 includes a variable gain amplifier (VGA) 102, a receive equalizer 104, a data slicer 114 and a decision feedback equalizer (DFE) 112, which together serve as an operative unit 101 of the receiver which performs its task, by converting analog signals from an input channel 120 into digital signals that are provided on an output line 122, using methods known in the art. A serial-in parallel-out (SIPO) unit 138 optionally converts the serial output of data slicer 114 into parallel words of, for example, 16, 32 or 64 bits, as is known in the art.

In order to allow for debugging and troubleshooting when necessary, an internal analog signal of receiver 100, for example on line 106 in FIG. 1, is, in parallel to its regular operational path, also coupled to the input of a monitoring slicer 110, for probing purposes. Monitoring slicer 110 compares the value on line 106 to a reference voltage value (REF) on a reference line 108, that is also input to the monitoring slicer 110, and provides an output that indicates whether the value on line 106 is higher or lower than the reference voltage. Optionally, for compactness, the indicating output consists of a single bit, allowing simple and easy implementation, even at high operation rates. Alternatively, the comparison results may be encoded into two or more bits for robustness. Monitoring slicer 110 can be implemented in a much smaller area than an analog to digital converter (ADC) operating at the same rate (generally less than 10% or even less than 1% of the area required for an ADC), and has a much lower power consumption. Monitoring slicer 110 is optionally configured to operate at the same rate as data slicer 114 and/or of some other unit of receiver 100. In some embodiments, monitoring slicer 110 provides comparison bits at a clock rate of receiver 100, providing a single comparison output for each clock period.

Using methods described hereinbelow, a known test signal is provided to receiver 100 in a plurality of rounds, in which different reference values are provided on reference line 108. During each round in which the test signal is provided, monitoring slicer 110 provides a sequence of comparison results which are then used to determine the value on line 106 to a desired accuracy, based on the assumption that receiver 100 responds the same way each time the test signal is provided. It will be appreciated that increasing the number of reference levels for which comparison rounds are performed, generally increases the accuracy of the determination.

In an exemplary embodiment, the bit results of the comparison are passed through a serial-in parallel-out (SIPO) unit 134, for example a 32 bit SIPO unit, so as to allow reading the comparison results at a lower rate than the rate at which they are produced. Using a 32 bit SIPO, the reading of the results needs to be performed only once every 32 clock periods, in embodiments in which a single comparison bit is provided in each clock period. In some embodiments, a register 121 holds the results, until they are retrieved by logic analyzer 126. In other embodiments, however, a register is not used and analyzer 126 is adapted to timely collect the comparison results, even without a register.

When it is desired to test the receiver 100, logic analyzer 126, or any other suitable data acquisition unit, is optionally connected to an output port 146 of multiplexer 123. Logic analyzer 126 retrieves and accumulates the contents of register 121 at a required rate, so as to retrieve the contents of register 121 immediately after it is full with comparison bits not previously retrieved, before the bits are overwritten. When an internal memory 136 of logic analyzer 126 is full, the logic analyzer stops acquiring the comparison results from register 121 and transfers the contents of its internal memory 136 to an external memory 128, for analysis by a processor 130. It will be appreciated that processor 130 may be dedicated for the analysis of the comparison results or may be a general purpose processor configured to perform various tasks including the analysis of the comparison results.

In some embodiments, receiver 100 includes a marker generator 140 and a multiplexer 123 which periodically insert a marker bit sequence instead of (or between) the comparison results retrieved from SIPO unit 134, for time alignment purposes. Register 121 may be positioned before multiplexer 123, as shown, or after multiplexer 123, between multiplexer 123 and port 146.

Optionally, the marker bit sequence is inserted at the beginning of the response to each repetition of the test signal. Alternatively, the marker bit sequence is inserted at an arbitrary point in the middle of the response to the test signal, which then serves as a beginning point for the analysis. Further alternatively or additionally, the marker bit sequence is inserted once every several test signals, for example when several test signals are provided one after the other, at known intervals.

Figure 2:
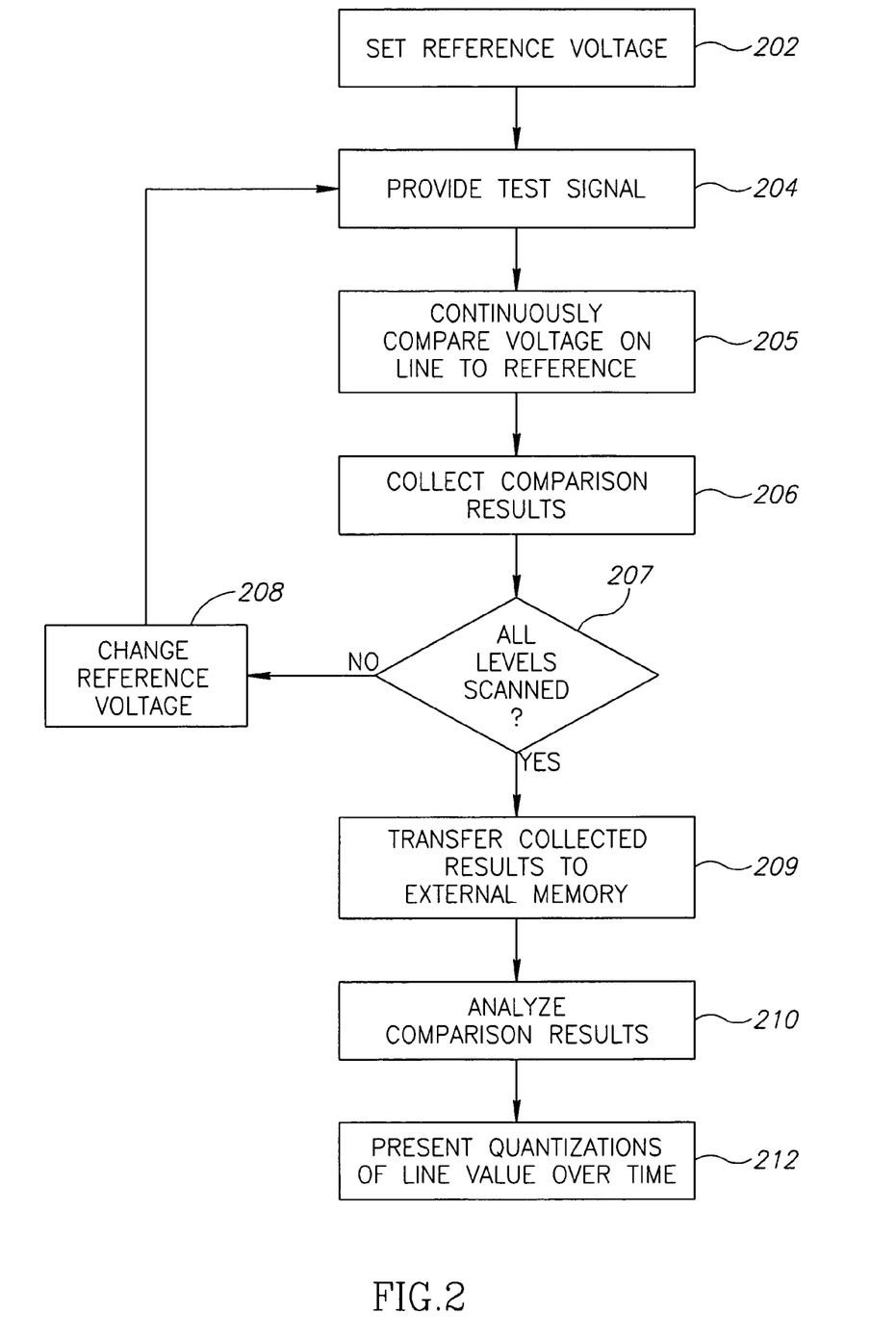
FIG. 2 is a flowchart of a method for testing an internal signal in a receiver, in accordance with one embodiment.

FIG. 2 is a flowchart of a method to test receiver 100, in accordance with one embodiment. The reference voltage on line 108 is set (202) to a first level and a test signal for debugging purposes is provided (204) on input channel 120. During the operation of receiver 100, monitoring slicer 110 periodically compares (205) the voltage on line 106 to the reference voltage on line 108, and provides a sequence of comparison result bits indicating whether the voltage on line 106 is above or below the reference voltage on line 108. The comparison bits are accumulated in register 121 and are timely collected (206) therefrom, by logic analyzer 126. If (207), after completion of handling the test signal, all the intended reference levels are not yet scanned, the reference voltage in line 108 is changed (208) to a different value, and the provision (204) of the test signal and the collecting (206) of the comparison bit results are repeated. This process is further repeated until comparison results are collected for a sufficient number of reference levels. The comparison bits are then transferred (209) to memory 128 by logic analyzer 126 for analysis by processor 130.

The comparison results taken for each instance of the provided test signal, at a same relative time point from the beginning of the test signal, are analyzed (210) by processor 130, to determine the reference voltage levels immediately above and below the analog value on line 106, for the specific relative time period. Optionally, in the analysis, processor 130 divides the received comparison bits into cycles corresponding to a single provision of the test signal. Each cycle optionally has a predetermined number of comparison bits, depending on the length of the test signal or the portion of the test signal for which comparison bits are collected. The comparison bits having the same relative positions in their cycles relate to the value on line 106 at a specific time and are used to determine that value.

The dividing of the received comparison bits into cycles is optionally performed by parsing the stream of bits according to the number of bits in each cycle. Alternatively or additionally, processor 130 divides the bits into cycles based on the marking bits inserted by marker generator 140. In some embodiments, marker bits are provided only every several cycles and processor 130 uses both symbol counting and marker identification in identifying beginning points of cycles.

The determined reference values are then presented (212) as quantizations of the value on line 106 over time.

Referring in detail to providing (204) the test signal, in some embodiments the test signal is provided from transmitter 132, which transmits the test signal to the receiver 100. Alternatively, the test signal is provided by test equipment coupled to the receiver 100 or any other suitable test signal source. Further alternatively, when receiver 100 is included in a transceiver, the test signal may be provided to receiver 100 from a transmitter portion of the transceiver.

Optionally, the test signal is provided to receiver 120 as an analog signal. The test signal may be generated originally as an analog signal or may be constructed from a digital sequence by transmitter 132 or other appropriate analog test signal generator. In an exemplary embodiment, the analog test signal is generated from a Pseudo-Random Binary Sequence (PRBS), such as PRBS 11, which includes 2047 symbols. Alternatively, the test signal is generated from a portion of a known long sequence, for example a predetermined portion of the PRBS58 signal. As mentioned above, in some embodiments, the test signal is provided a plurality of times, at least once for each of a plurality of different reference voltage levels. In some embodiments, the test signal is a cycle of a periodic signal and each cycle of the periodic signal is considered as another provision of the test signal.

In other embodiments, the test signal is not provided repeatedly or is not provided repeatedly for each of the reference voltage levels. Instead, for each comparison bit, processor 130 determines a state of receiver 100 for that comparison bit, based on the input to the receiver 100 around the time at which the comparison bit was determined. Optionally, processor 130 defines a plurality of logical bins corresponding to different inputs to the receiver 100 and places each comparison bit and corresponding reference voltage in its corresponding logical bin. When sufficient numbers of comparison bits and corresponding reference levels are collected for each logical bin, voltage levels are determined for each of the bins and the signal on line 106 is thereby reconstructed. Alternatively, the reconstruction may be performed even when some of the bins are lacking in information. In accordance with this alternative, processor 130 optionally uses neighboring values and/or the available information, for determining the values of bins not having sufficient information. In other embodiments, in accordance with this alternative, processor 130 determines values only for time points having sufficient information in their corresponding bins, and the channel from transmitter 132 to receiver 100 is estimated using the determined time points. These embodiments are particularly suitable for receivers having a relatively short channel window (i.e., where the output of receiver 100 at any time point depends only on a relatively short segment of the recently provided input), such that only a small number of bins needs to be managed.

Optionally, separate bins are defined for each possible input sequence of a window length which may affect the state of receiver 100. Alternatively, bins are defined for a shorter channel window, including a length which is responsible for a substantial portion (e.g., more than 50%, more than 80%) of the effect on the state of the receiver, thus reducing the number of bins involved, at the cost of lower accuracy.

In some embodiments, especially when the input signal is not provided repeatedly, a long known signal (e.g., the PRBS58 signal) or any other type of test signal may be used as the test signal, including a regular data transmission signal not known in advance. The test signal is optionally provided to processor 130 for the analysis as discussed hereinbelow in detail.

The number of reference voltage levels for which the collecting (206) of comparison results is repeated is optionally selected as a compromise between the desired accuracy of the knowledge of the value on line 106 and the speed at which the information is collected and/or the available memory for storing the comparison results. In various embodiments, the collection of comparison bits is repeated for at least 16, at least 32 or even at least 64 different voltage reference levels. In an exemplary embodiment, 128 levels are used.

In some embodiments, the collection (206) of comparison bits is performed for each voltage reference level only once. In other embodiments, the collection of comparison bits for each reference level is performed a plurality of times to increase accuracy. It will be appreciated that increasing the number of repetitions of the input signal for a specific reference voltage typically increases its accuracy in terms of signal-to-noise ratio, since the noise, which typically has a mean value of 0, is averaged, thus reducing its variance.

The collecting (206) of comparison bits is optionally performed throughout the provision of the test signal. Alternatively, the collection of comparison bits is performed for a specific segment of the provided test signal. For example, monitoring slicer 110 may have an operation selection line 167 controlled internally by marker generator 140 (or other appropriate control unit), which monitors the timing of the test signal, as described hereinbelow, and accordingly instructs monitoring slicer 110 when to operate.

Alternatively, monitoring slicer 110 may operate continuously, but for portions of the test signal which are not of interest, its comparison bit results are not provided to register 121 (e.g., by disconnecting the line leading from monitoring slicer 110 to register 121), or are not provided from register 121 to logic analyzer 126 (e.g., by disconnecting the line leading from register 121 to port 146) or are not collected by logic analyzer 126. Further alternatively or additionally, processor 130 may not analyze some comparison bits, corresponding to portions of the test signal not of interest.

In FIG. 1, receiver 100 is shown as having only a single monitoring slicer 110. In other embodiments, receiver 100 may include a plurality of monitoring slicers in order to split the number of repetitions required between the monitoring slicers and to shorten the time until the results are provided by processor 130. In such embodiments, each of the monitoring slicers optionally provides one or more comparison bits for each clock cycle of receiver 100 and these bits are placed next to each other in register 121. Register 121 is either made larger to have room for the comparison bits of all the monitoring slicers or logic analyzer 126 is configured to retrieve the contents of register 121 at a higher rate. The number of monitoring slicers 110 used in parallel is optionally smaller than 10 or even smaller than 5, in order to limit the area required by the monitoring slicers.

The reference voltage levels may be input to the receiver on line 108 in substantially any order. In some embodiments, the reference voltages are scanned in order of magnitude, from lowest to highest or from highest to lowest, to simplify the changing of the reference voltage level. Alternatively, the reference voltages are scanned in an intermittent order. Optionally, the reference voltage levels are scanned in an order progressively providing increased accuracy, so that partial results may be provided while further voltage levels are scanned to increase the accuracy. In some embodiments, in accordance with this option, processor 130 begins providing intermediate results after a predetermined percentage of voltage levels are scanned, for example after 50% of the reference voltage levels are scanned.

In an exemplary embodiment, for each reference voltage level, comparison bits are collected for a predetermined number of cycles and then further collection is stopped until the reference voltage is changed. Once the reference voltage is changed, logic analyzer 126 resumes collecting the comparison bits for the predetermined number of cycles.

Monitoring slicer 110 optionally operates at the same rate as data slicer 114, providing a single comparison bit for each clock cycle of receiver 100. Optionally, monitoring slicer 110 and data slicer 114 operate with the same clock signal. In some embodiments, the timing of monitoring slicer 110 is aligned with the timing of data slicer 114, such that they relate to the signal on line 106 at the same time points. In some embodiments, the output of monitoring slicer 110 is provided while the receiver is in its normal operating mode and its timing is phase locked onto the transmitter, such that the timing of receiver 100 is aligned to the timing of the transmitter 132. Alternatively, the timing of monitoring slicer 110 is not necessarily aligned with that of data slicer 114 and/or with the output on line 122, such that monitoring slicer 110 and data slicer 114 sample the signal on line 106 at different points within each clock cycle.

In some embodiments, when it is desired to receive more accurate information on the behavior of the signal on line 106, sampling sessions including the provision of test signals and collection of comparison bits for all the voltage levels, are performed for a plurality of different phase differences between the timing of the input test signals and the operation of monitoring slicer 110. For example, in order to determine the voltage level on line 106 four times in each clock cycle of receiver 100, a first sampling session is carried out in which comparison bits are collected for all the reference voltage levels while monitoring slicer 110 is time aligned to the input signal. The phase of monitoring slicer 110 is then adjusted to be a quarter of a clock cycle after the input signal and another sampling session including the collection of comparison bits for all the reference value levels is performed. Additional sampling sessions are carried out with the clock signal of monitoring slicer 110 adjusted to be half a clock cycle and three quarters of a clock cycle after the input signal. It will be understand that other orders of sampling sessions may be used interchangeably.

Optionally, the phase difference is achieved by providing the clock of both the transmitter and the receiver from a common source, with the clock signal of the receiver (or of the transmitter) passing through a phase shifter on its way from the common source.

Alternatively to scanning through all the reference voltage levels in each sampling session, one or more of the sampling sessions may be performed for fewer reference voltage levels. In analyzing (210) the comparison results, processor 130 may, for example, use the comparison results from the sampling sessions performed for a large number of reference voltage levels in reconstructing the internal signal on line 106, while the results from the other sampling sessions are used to identify abrupt changes in the internal signal. In other embodiments, the results from a first sampling session are analyzed to determine the range of reference voltages to be used in further scanning sessions.

Logic analyzer 126 preferably has sufficient memory to store the comparison bits of all the test signal cycles for all the levels of reference voltages. Optionally, if necessary, the test signal may be relatively short, e.g., corresponding to less than 10,000 symbols or even less than 5,000 symbols, in order to allow all the comparison bits to fit within the internal memory 136 of logic analyzer 126. Alternatively or additionally, the number of repetitions and/or reference voltage levels is adjusted so that the comparison bits fit within the internal memory 136.

Alternatively, when the internal memory 136 is full, the collection (206) of comparison bits is stopped while the contents of the internal memory 136 of logic analyzer 126 are transferred to an external memory 128 and the collection of bits is resumed when the transfer is completed. Optionally, the provision of test signals and/or the changing of the reference level is stopped during the transfer of the data of logic analyzer 126 to external memory 128.

In some embodiments, for each voltage reference level, comparison bits are collected (206) until the internal memory 136 is full. When the comparison bits are transferred to external memory 128, the voltage reference level is changed and the collection of comparison bits is repeated. Alternatively, the reference voltage is updated during the collection of comparison bits, such that the number of separate memory transfers from logic analyzer 126 to external memory 128 is lower than the number of reference levels, optionally lower than twenty or even lower than ten reference levels.

Instead of transferring the results when the internal memory 136 is full, logic analyzer 126 may optionally be configured to transfer the results after a predetermined amount of data is collected, for example each time the reference voltage is changed and/or after a predetermined number of test signal cycles. In some embodiments, the marker bit sequence triggers the transfer of data by logic analyzer 126. Optionally, logic analyzer 126 reviews the signals it retrieves from register 121 and determines when to transfer the contents of its internal memory 136, based on the identification of the marker sequence. In some embodiments, logic analyzer 126 exports the content of its internal memory 136 each time the marker sequence is identified. In another embodiment, logic analyzer 126 transfers its internal memory after a predetermined number of marker sequences are identified.

Referring in detail to presenting (212) quantizations of the value on line 106 over time, the value taken to represent the voltage on line 106 is optionally an average of the closest lower and higher reference voltages Alternatively, the closest lower voltage level or the closest higher voltage level may be used. Further alternatively, the voltage level is reconstructed using any other suitable function of the collected comparison bits for the various reference voltages.

In some embodiments, a preliminary calibration procedure is performed to correlate between the comparison bit results and actual values monitored on line 106. Optionally, during the calibration procedure, known analog values are injected on line 106 and comparison bits are collected for the injected analog values. Accordingly, a table which maps the comparison bit results with analog values on line 106 may be generated and then used in selecting voltage levels based on the comparison bits.

Optionally, the signal injection for the preliminary calibration procedure is performed by providing a known input line at the input 120 of the receiver 100, such that a known signal appears on line 106. Alternatively, an external port 156 is positioned on line 106 in a manner which allows connecting an external signal source directly to line 106. Further alternatively or additionally, receiver 100 is produced with an internal signal generator (illustrated in FIG. 3) adapted to generate signals for calibration, connected to line 106. It is noted that although it is simplest to connect the external source or internal source directly to line 106, the source may be connected to a different point close to line 106, having a predictable relation to the signal on line 106, such as when the chip layout better supports connecting at a different point, for example.

The method of FIG. 2 is optionally controlled by a controller 172 external to receiver 100. While controller 172 is shown as a stand alone unit, in other embodiments it may be implemented on processor 130 or on logic analyzer 126. Controller 172 optionally governs the provision of test signals and the switching of receiver 100 into a test mode in which monitoring slicer 110 and marker generator 140 are operative. In an exemplary embodiment, when logic analyzer 126 is connected to port 146, receiver 100 moves into the test mode, while when an external unit is not connected to port 146, receiver 100 operates in a regular mode in which monitoring slicer 110 and marker generator 140 are inoperative. In some embodiments, receiver 100 includes a control signal port 158 which is used for provision of control signals from the controller to marker generator 140 and/or monitoring slicer 110. Control signal port 158 may be separate from port 146 or may be adjacent thereto, such that a single interface may be used to connect external apparatus to both ports.

In some embodiments, one or more parameters of the method of FIG. 2, such as whether monitoring slicer operates continuously or only intermittently, are configurable by controller 172 through port 158. The control of the reference voltages may be performed directly by the external controller 172 through port 158 or may be performed internally by marker generator 140 (or other appropriate internal controller), possibly following instructions received from the external controller 172.

Figure 3:
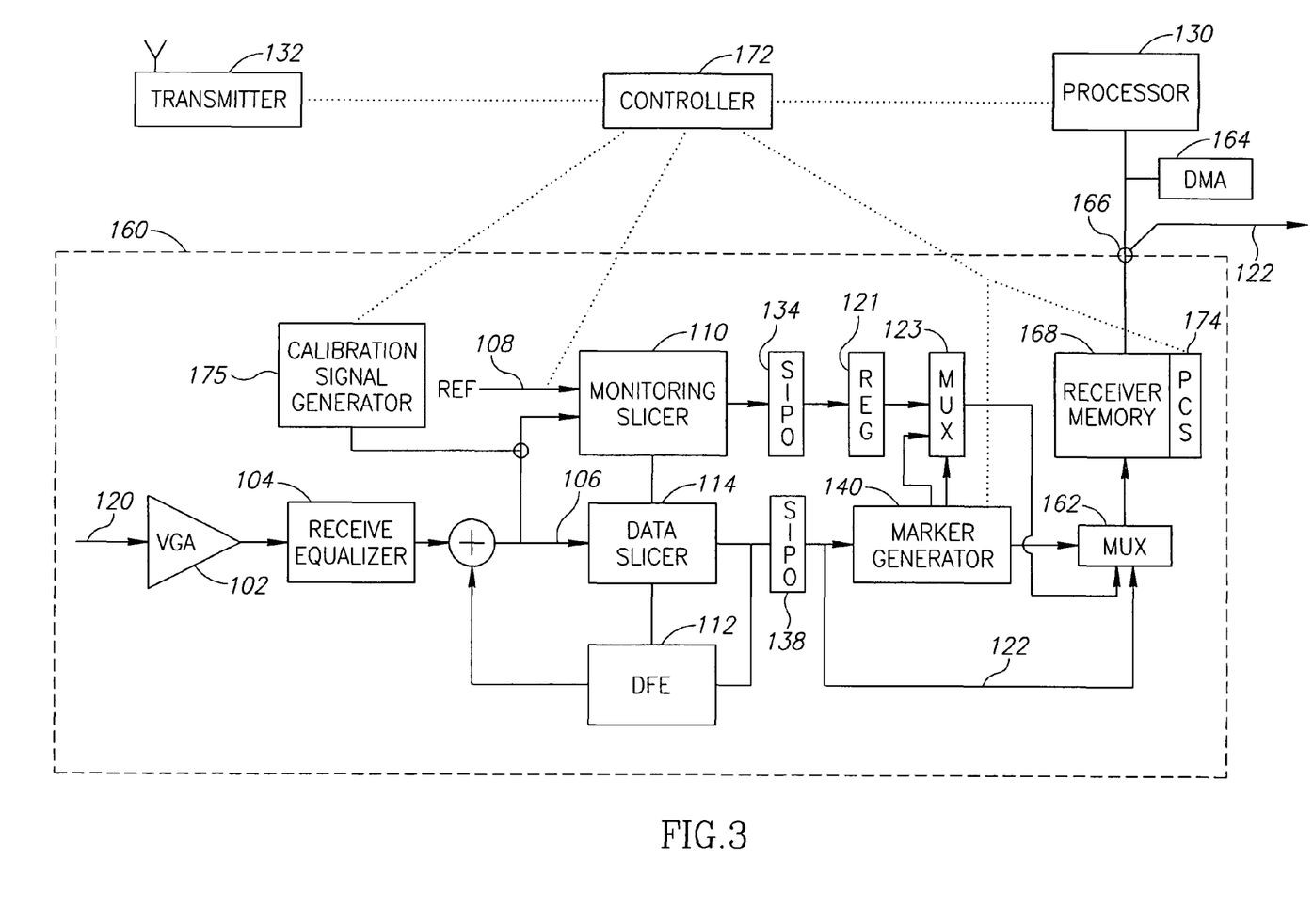
FIG. 3 is a schematic illustration of a receiver, in accordance with another embodiment.

FIG. 3 is a schematic illustration of a receiver 160, in accordance with another embodiment. Receiver 160 is similar to receiver 100 of FIG. 1, but differs in the way it accumulates the comparison bits. In receiver 160, a receiver memory 168 normally used for collecting the data received by the receiver and output on line 122 is used alternatively or additionally to store the comparison bits. A multiplexer 162, controlled by marker generator 140 or by an external controller 172 through a dedicated control port, determines whether data from line 122 or from register 121 is to be stored in receiver memory 168. Whilst the receiver 160 is being tested, a Direct Memory Access Controller (DMA Controller) 164 or other appropriate data transfer unit is connected to a port 166 and periodically transfers the comparison bits from receiver memory 168 to processor 130 for analysis. The data transfer is optionally performed without interrupting the collection of data from register 121. Alternatively to using an external data transfer unit, software of receiver 160, for example running on an internal physical coding sub-layer (PCS) 174 or any other logic unit, may transfer the comparison bits from memory 168 to processor 130, or to an external memory associated therewith.

In some embodiments, in a testing mode, multiplexer 162 continuously transfers data from multiplexer 123 only, and output line 122 is effectively disconnected. Alternatively, receiver memory 168 collects both comparison bits from register 121 and output data from line 122, optionally for use by processor 130, as discussed hereinbelow.

FIG. 3 further illustrates the use of a calibration signal generator 175 which is adapted to inject calibration signals on line 106 during a calibration procedure. Calibration signal generator 175 is optionally inoperative during normal use and during test sessions. When, however, it is desired to perform a calibration procedure in which values on line 106 are correlated with the comparison results, for example, before the beginning of a test session, controller 172 instructs calibration signal generator 175 to provide a predetermined sequence of analog levels on line 106. In addition, monitoring slicer 110 is instructed to generate comparison results and PCS 174 is instructed to transfer the collected comparison results to processor 130. Optionally, during the calibration procedure, transmitter 132 does not provide signals and/or the operative portion of receiver 100 is inoperative, so as not to interfere with the calibration. It is noted that calibration signal generator 175 may be configured with only a single calibration sequence or may be calibrated with a plurality of sequences from which it selects one according to the instruction from controller 172. Alternatively to a predetermined sequence, controller 172 provides specific instructions on which signals are to be provided at every moment.

Processor 130 analyzes the collected comparison bits and based on a comparison to the predetermined sequence of analog levels provided by controller 172, calibrates itself for reconstructing the signal on line 106 from the comparison results.

In some embodiments, at the beginning of each time that a test signal is provided (204), multiplexer 123 is instructed to provide a marker bit sequence in parallel to provision of the test signal, so that processor 130 can thereby identify the start of a response to the test signal. In one embodiment, the test signal and the instruction to multiplexer 123 are provided together from marker generator 140 or from another appropriate controller. Alternatively, the test signals are provided under control of a controller that is separate from marker generator 140, and marker generator 140 identifies the marking point of the test signals according to an analysis of the output of receiver 100 on line 122. Marker generator 140 optionally uses the output on line 122 to identify the marking point, particularly in configurations where receiver 100 is phase locked on its input, such that the output on line 122 follows the input to the receiver.

Alternatively or additionally, marker generator 140 identifies the marking point based on an analysis of the input signal provided to receiver 100. This alternative is especially useful in an open loop configuration in which receiver 100 does not phase lock onto the input signal and therefore the output signal does not provide meaningful timing information regarding the input signal. It is noted that the timing of marker generator 140 does not necessarily need to be the same as that of data slicer 114, and there may, therefore, be a phase difference between their timings, as long as marker generator 140 provides the markers at the same time point relative to the input signal. In the open loop configuration, the transmitter and receiver 100 optionally operate on a clock signal from a common, i.e. shared source, thereby preventing clock skew. It will be appreciated that the open loop configuration may be used even when the feedback loop of DFE 112 is disconnected.

In some embodiments, the test signals are provided in the form of a periodic signal which includes a plurality of instances of the test signal. Marker generator 140 optionally identifies a beginning point of the test signal sequence from the periodic signal and provides the marker sequence each time a new repetition begins or once every predetermined number of cycles.

The marker bit sequence is sufficiently long and/or has a sequence not expected from normal measurements, such that it can be easily identified by processor 130. Optionally, the marker bit sequence has a 32 bit length, equal to the length read by logic analyzer 126. In an exemplary embodiment, the marker sequence has the form of alternating '0' and '1' bits, stated in Hexadecimal notation as AAAAAAAA—a sequence which is not normally expected as it indicates a continuous changing of the values on the line. Alternatively, some or all of the marker may be used to convey information concerning the collected comparison bits to processor 130, such as the level of the reference voltage and/or a counter which indicates the number of marker sequences provided. In some embodiments, the marker sequence includes information which aids in identifying the input test signal, for example in what portion of a known long sequence the test signal is located. Thus, 16 bits of the marker bit sequence may include alternating '0' and '1' bits, while the rest of the marker bits provide information, for example.

In some embodiments, processor 130 is also provided with the output of receiver 100 on line 122, for its analysis. This option is especially useful when the test signal is not a known sequence. The outputs of monitoring slicer 110 and of data slicer 114 may be provided on the same line intermittently, such that the output from line 122 provides a timing frame for the comparison bits. For example, receiver 100 may include an additional register carrying the output data from line 122, and logic analyzer 126 intermittently collects data from the different registers. Alternatively or additionally, unique marker bits are added to the provided data and to the corresponding comparison bits in a manner which correlates them to each other, thereby synchronizing the data and the comparison bits for processor 130. In accordance with this alternative, logic analyzer 126 optionally works twice as fast as when only the comparison bits are collected.

In some embodiments, only some of the output signals on line 122 are collected by logic analyzer 126, thereby reducing the required operation rate thereof. For example, with each set of 32 comparison bits, logic analyzer 126 may collect 8 or 12 bits from output line 122, and processor 130 uses these output bits to reconstruct the entire output signal at the specific time. The reconstruction of the entire signal may be based on knowledge of the form of the input test signal and/or processor 130 is provided with a copy of the entire input signal. Alternatively or additionally, logic analyzer 126 only collects some of the comparison bits. In such alternative embodiments, additional operation cycles may be performed to compensate for the lost comparison bits not collected by logic analyzer 126.

In analyzing the results, processor 130 optionally identifies the marker bits and marks them as erasures. Optionally, processor 130 uses the additional fields in the marker bits for synchronization and processing. Processor 130 optionally identifies incorrect readings and ignores them. For example, when the comparison bits for the same time and voltage reference contradict, the more prevalent result of the comparison is optionally considered as being the correct result. In some embodiments, when a repetition is found to have more than a predetermined number of comparison results determined to be incorrect, the entire repetition is considered unreliable and discarded, as its timing is assumed to be incorrect.

Receiver 100 may be of various types and/or applications. In one embodiment, receiver 100 comprises a serial receiver having a high transmission speed of, for example, 10.3125 Giga bits per second (Gbps), which is the speed prescribed by the IEEE 802.3ap standard, IEEE Std. 802.3ap-2007, published May 22, 2007. The monitoring slicer may be connected to substantially any internal position of the device, for example at the end of a receiver chain of a receiver, immediately before converting into digital format.

While transferring the results of the comparison in only a single bit is most compact, some embodiments may involve encoding the comparison results in more than one bit, for robustness, for example when the comparison results are transferred to processor 130 over a noisy (e.g., a wireless) communication link. In an exemplary embodiment, each comparison bit is encoded using two bits. In another embodiment, a sequence of comparison results are encoded together adding a factor of, for example, between 20%-40% bits. For example, a sequence of 24 comparison results may be encoded into 32 bits, using any encoding method known in the art.

In the above description, SIPO unit 134 is described as accumulating 32 bits. It is noted however, that a larger or smaller SIPO unit may be used. For example, if a faster logic analyzer 126 is available, a smaller SIPO unit 134 may be used. If a slower logic analyzer 126 is used, a larger SIPO unit 134 may be required.

The presented (212) voltages on line 106, serve as an estimate of the voltage on line 106 and may be used in various tasks, such as end-to-end channel estimation (a.k.a. Impulse response estimation), from transmitter to receiver, using any suitable method known in the art, such as a least-squares estimation of the channel based on the known input signal and the estimated signal on line 106 determined from the comparison bits. Other methods which may be used for channel estimation include, for example, Least-Mean-Squares (LMS) estimation or Recursive-Least-Squares (RLS) estimation.

Additional tasks which may be performed using the readings of a monitoring slicer 110, in accordance with the above described methods include, inter alia, estimation of additional channels, such as near-end and/or far-end crosstalk channel estimation, analysis of the analog signal before channel estimation, distortion analysis and/or frequency-domain analysis, as well as other methods for which ADCs are generally used. In some embodiments, processor 130 additionally provides diagnostics based on the results of the analysis, such as indications of mismatches and/or irregularities on the transmission line, which may, for example, be based on Time-Domain-Reflectometry (TDR). In some embodiments, processor 130 analyzes the quality of the equalization of the channel.

In some embodiments the determination of the receiver response to a specific input is repeated in a plurality of different conditions and the analysis includes comparing the results from the different conditions, for example subtracting the estimated channels obtained from measurements under two different conditions. For example, a crosstalk channel is optionally measured by measuring the channel whilst a crosstalk signal is applied and then again when the crosstalk is turned off, cancelled or changed to a signal with a low correlation with the test signal. The crosstalk channel is optionally estimated as the difference between the measured channels. In an exemplary embodiment, the method of FIG. 2 is used in estimating an impulse response of a decision feedback equalizer (DFE) tap. The channel is estimated with and without the DFE tap and the difference between the estimations are used in determining the impulse response.

There is therefore provided in accordance with an exemplary embodiment, a device, comprising a monitoring slicer adapted to repeatedly sample an internal analog signal to provide a sequence of digital outputs indicating a result of a comparison of the level of the internal analog signal to a reference voltage, and an operative unit adapted to perform a task of the device and provide a result without using digital outputs from the monitoring slicer.

Optionally, the monitoring slicer is adapted to operate only when the device is in a test mode. Optionally, the device includes a reference voltage source adapted to provide a plurality of different reference voltage levels to the monitoring slicer. Optionally, the reference voltage source is adapted to change the reference voltage level it provides at predetermined intervals. Alternatively or additionally, the reference voltage source is adapted to change the reference voltage level it provides responsive to an analysis of the result of the operative unit. Optionally, the device includes a controller configured to periodically insert marker bits within the provided sequence of digital outputs in a manner such that the indication marker bits are located at same relative positions within a plurality of repetitions of a test signal provided to the device.

Optionally, the sequence of digital outputs from the monitoring slicer includes a single bit for each comparison. Optionally, the device includes a serial-input parallel-output unit configured to group bits of the sequence of digital outputs into words for retrieval by an external unit.

There is further provided in accordance with an exemplary embodiment, a device, comprising a monitoring slicer adapted to repeatedly sample an internal analog signal to provide a sequence of digital outputs indicating a result of a comparison of the level of the internal analog signal to a reference voltage, and a controller configured to periodically insert marker bits within the provided sequence of digital outputs in a manner such that the indication marker bits are located at same relative positions within a plurality repetitions of a test signal provided to the device.

Optionally, the internal analog signal is sampled from an internal signal line adapted to carry an analog signal of a receiver before the signal is supplied to a data slicer. Optionally, the controller is adapted to change the reference voltage value. Optionally, the controller is adapted to change the reference voltage value over at least 32 different values. Optionally, the controller is adapted to insert the marker bits at times determined in a manner responsive to an output of the electronic device. Optionally, the controller is adapted to insert marker bits which indicate the current reference voltage of the reference voltage source.

There is further provided in accordance with an exemplary embodiment, a method of monitoring an internal analog value on an internal line of a device, comprising providing a monitoring slicer connected to a reference voltage source and to the internal line; providing the device with a plurality of repetitions of a test signal, while the reference voltage source provides different reference values, and analyzing comparison results received from the monitoring slicer at times when a plurality of different reference voltages are provided by the reference voltage source, to provide an indication of the level of the analog signal on the internal line.

Optionally, analyzing the comparison results comprises determining a level of the analog signal on the internal line, at a specific relative time point, based on an average of at least two comparison results for each reference voltage level. Optionally, analyzing the comparison results comprises providing a channel estimation of an impulse response of an end-to-end channel of the device. Optionally, analyzing the comparison results comprises an analysis based on comparison results from at least 100 repetitions of the test signal.

Optionally, analyzing the comparison results comprises analyzing based on comparison results from at least 20 repetitions of the test signal for each reference voltage level. Optionally, the method includes extracting the comparison results from the device by a logic analyzer. Optionally, the method includes transferring the comparison results from the logic analyzer to a processor for performing the analysis in a plurality of transfer iterations.

Optionally, providing the device with a plurality of repetitions of a test signal is performed while the device is in a closed loop operation state. Alternatively, providing the device with a plurality of repetitions of a test signal is performed while the device is in an open loop operation state. Optionally, analyzing the comparison results comprises reconstructing a signal on the internal line based on the comparison results and applying Time-Domain-Reflectometry (TDR), to the reconstruction of the signal. Optionally, analyzing the comparison results comprises selecting analog values corresponding to comparison bit results based on calibration results from a calibration procedure in which known analog values are injected on the internal line.

There is further provided in accordance with an exemplary embodiment, an internal signal analyzer, comprising an input interface configured to receive sequences of comparison results between reference values and an internal signal from a device; and a processor configured to determine for the received sequence of comparison results, corresponding timing information and reference levels to which they were compared and to estimate the internal signal of the device.

Optionally, the processor is configured to determine the corresponding timing information lo responsive to a corresponding output from the device and/or responsive to marker sequences implanted in the sequences of comparison results. Optionally, the processor is configured to estimate the internal signal of the device based on at least 64 sequences of comparison results based on at least 64 different reference values. Optionally, the sequences of comparison results include comparison bits at a rate of at least 100 MHz.

There is further provided in accordance with an exemplary embodiment, an internal signal determination system, comprising a reference voltage generation unit adapted provide a plurality of different reference voltage levels; a receiver configured to provide comparison results of an internal value with reference voltages from the reference voltage generation unit; a test signal source adapted to provide a test signal to the receiver; a signal retriever adapted to collect comparison results from the receiver; and a processor configured to estimate the internal signal based on comparison results collected by the signal retriever for a plurality of different reference voltage levels.

Optionally, the reference voltage generation unit is a sub-unit included in the receiver. Alternatively, the reference voltage generation unit is external to the receiver. Optionally, the signal retriever is adapted to collect signals from the receiver at a rate of at least 5 Giga-bits per second.

It will be appreciated that the methods described hereinabove may be varied in many ways, including, changing the order of some of the steps, and/or performing a plurality of steps concurrently. It will also be appreciated that the above described description of methods and apparatus are to be interpreted as including apparatus for carrying out the methods and methods of using the apparatus. It should be understood that features and/or steps described with respect to one embodiment may sometimes be used with other embodiments and that not all embodiments have all of the features and/or steps shown in a particular Figure or described with respect to one of the specific embodiments.

Structure and acts described herein may be replaceable by equivalents which perform the same function, even if the structure or acts are different, as known in the art. For example, the tasks of logic analyzer 126 and processor 130 may be performed by a single unit. Variations of embodiments described will occur to persons of the art. Therefore, the scope of the invention is limited only by the elements and limitations as used in the claims, wherein the terms "comprise," "include," "have" and their conjugates, shall mean, when used in the claims, "including but not necessarily limited to."

The invention claimed is:

1. A device, comprising:
a monitoring slicer adapted to repeatedly sample an internal analog signal to provide a sequence of digital outputs indicating a result of a comparison of the level of the internal analog signal to a reference voltage, and
an operative unit adapted to perform a task of the device and provide a result without using digital outputs from the monitoring slicer.

2. The device according to claim 1, wherein the monitoring slicer is adapted to only operate when the device is in a test mode.

3. The device according to claim 1, comprising a reference voltage source adapted to provide a plurality of different reference voltage levels to the monitoring slicer.

4. The device according to claim 3, wherein the reference voltage source is adapted to change the reference voltage level it provides at predetermined intervals.

5. The device according to claim 3, wherein the reference voltage source is adapted to change the reference voltage level it provides responsive to an analysis of the result of the operative unit.

6. The device according to claim 1, comprising a controller configured to periodically insert marker bits within the provided sequence of digital outputs in a manner such that the indication marker bits are located at same relative positions within a plurality of repetitions of a test signal provided to the device.

7. The device according to claim 6, wherein the controller is adapted to insert marker bits which indicate the current reference voltage of the reference voltage source.

8. The device according to claim 6, wherein the controller is adapted to insert marker bits at times determined responsive to an output of the operative unit.

9. The device according to claim 1, wherein the sequence of digital outputs from the monitoring slicer includes a single bit for each comparison.

10. The device according to claim 1, comprising a serial-input parallel-output unit configured to group bits of the sequence of digital outputs into words for retrieval by an external unit.

11. An internal signal determination system, comprising:
a monitoring slicer adapted to repeatedly sample an internal analog signal to provide a sequence of digital outputs indicating a result of a comparison of the level of the internal analog signal to a reference voltage from a reference voltage generation unit;
an operative unit adapted to perform a task of the device and provide a result without using digital outputs from the monitoring slicer;
a test signal source adapted to provide a test signal to the operative unit;
a data acquisition unit adapted to collect comparison results from the monitoring slicer; and
a processor configured to estimate the internal signal based on comparison results collected by the signal retriever for a plurality of different reference voltage levels.

12. The system according to claim 11, wherein the reference voltage generation unit is a sub-unit included within a same physical unit including the operative unit.

13. The system according to claim 11, wherein the reference voltage generation unit is external to the physical unit including the operative unit.

* * * * *